United States Patent [19]

Hochhaus et al.

[11] Patent Number: 4,808,975

[45] Date of Patent: Feb. 28, 1989

[54] ARRANGEMENT FOR CHECKING AND INDICATING THE MALFUNCTION OF A LAMP IN MONITORING AND SWITCHING SYSTEMS

[75] Inventors: Hermann Hochhaus; Erhard Wilder, both of Neumünster, Fed. Rep. of Germany

[73] Assignee: Licentia Patent-Verwaltungs-GmbH, Frankfurt am Main, Fed. Rep. of Germany

[21] Appl. No.: 28,416

[22] Filed: Mar. 20, 1987

[30] Foreign Application Priority Data

Mar. 20, 1986 [DE] Fed. Rep. of Germany ....... 3609385

[51] Int. Cl.$^4$ ............................................. H08B 21/00
[52] U.S. Cl. .................................... 340/641; 250/551; 324/501
[58] Field of Search ............. 340/641, 643, 655; 315/88, 93; 324/501, 537, 506, 507, 510, 509, 536; 250/551; 200/DIG. 36

[56] References Cited

U.S. PATENT DOCUMENTS

| | | | |
|---|---|---|---|
| 3,237,099 | 2/1966 | Troll | 340/641 |
| 3,883,777 | 5/1975 | Morita | 340/641 |
| 3,984,765 | 10/1976 | Rocci, Jr. | 324/509 |
| 4,025,845 | 5/1977 | Lhommelet | 324/501 |

FOREIGN PATENT DOCUMENTS

| | | |
|---|---|---|
| 223269 | 6/1910 | Fed. Rep. of Germany . |
| 1967121 | 5/1978 | Fed. Rep. of Germany . |
| 2856630 | 7/1980 | Fed. Rep. of Germany . |
| 3036567 | 4/1982 | Fed. Rep. of Germany . |
| 3138297 | 4/1983 | Fed. Rep. of Germany . |
| 3241701 | 5/1984 | Fed. Rep. of Germany ...... 324/501 |
| 2356338 | 1/1978 | France . |
| 685776 | 1/1953 | United Kingdom . |
| 947491 | 1/1964 | United Kingdom . |
| 946362 | 1/1964 | United Kingdom . |
| 1476541 | 6/1977 | United Kingdom . |

OTHER PUBLICATIONS

"Burned-Out Pilot-Lamp Indicators", R. L. Ives; Electronics World, Jun. 1963, p. 40, vol. 69 #6.
"Inexpensive Remote Light Indicator Uses IC Timer", Sarpangal; Electronic Engineering, Mar. 1977, vol. 49 #589.

Primary Examiner—Joseph A. Orsino
Assistant Examiner—Jill D. Jackson
Attorney, Agent, or Firm—Spencer & Frank

[57] ABSTRACT

An arrangement for monitoring malfunctioning display lamps in control, switching, safety and indicator systems, wherein the display lamp, which is provided with a series resistor, is connected in parallel with the series connection of a visual indicator and an electronic circuit and this parallel connection is controlled in dependence on the operating state of the display lamp.

9 Claims, 2 Drawing Sheets

ARRANGEMENT FOR CHECKING AND INDICATING THE MALFUNCTION OF A LAMP IN MONITORING AND SWITCHING SYSTEMS

BACKGROUND OF THE INVENTION

The present invention relates to an arrangement for monitoring and reporting malfunctioning indicator lamps in control, switching, safety and indicator systems.

Signal lamps in control, switching, safety and display systems are conventionally tested for proper operation by visual checks and by monitoring by means of high frequency test devices via additional diode matrices. Such checking measures are complicated and cost intensive.

SUMMARY OF THE INVENTION

It is therefore an object of the invention to provide an arrangement with which the malfunction of an indicator lamp can be detected in a simple manner and indicated by means of a substitute signal.

The above object is generally achieved according to the present invention by an arrangement for monitoring and reporting a malfunctioning indicator lamp in control, switching, safety and indicator systems which comprises: an indicator lamp connected in a circuit to be monitored via a series resistor; and the series connection of a visual indicator and an electronic circuit, whose conduction is controlled in dependence on the operating state of the indicator lamp, connected in parallel with and bridging of the indicator lamp.

According to a feature of the invention the visual indicator may be an incandescent lamp but preferably is an optoelectronic device such as a light emitting diode (LED) or an LED or liquid crystal (LCD) display, while the electronic circuit may be a voltage or temperature dependent semiconductor device.

According to a further feature of the invention, the resistor and the series connected indicator lamp may constitute two legs of a bridge circuit, with the electronic circuit being a resistor forming a third leg of the bridge circuit, with the visual indicator being located in the transverse arm of the bridge circuit and with a further balancing resistors being provided and connected to form the fourth leg of the bridge circuit.

The particular advantages of the invention are that the regular maintenance required with the customarily employed indicator lamps having a short service life can be eliminated, that it is assured that a possible danger state is reliably indicated, and that the use of simple standard components results in low expenditures. Moreover, the arrangement is compatible with prior art embodiments

DETAILED DESCRIPTION OF THE PREFERRED EMBODIMENTS

Figure 1:
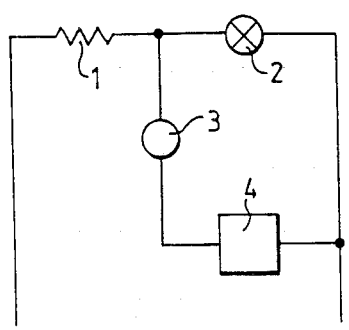
FIG. 1 shows the basic circuit arrangement according to the invention.

Referring now to FIG. 1, the basic alarm device is composed of a series resistor 1 connected in series with an indicator lamp 2 which are included in the circuit to be monitored. In order to monitor the lamp 2 for possible malfunctioning, the series connection of a visual indicator 3 and an electronic evaluation system 4 is connected in parallel with the indicator lamp 2.

The visual indicator 3 may be, for example, an incandescent bulb or an optoelectronic display, such as a light emitting diode (LED), or an LED or liquid crystal (LCD) display. If desired, the visual indicator 3 may be of the type which can selectively be caused to blink so as to produce a better malfunction signalling effect.

Figure 2:
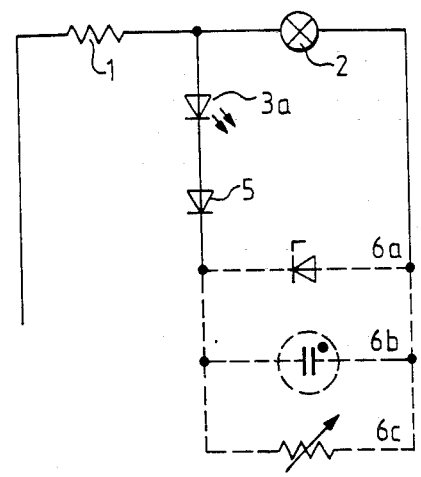
FIG. 2 shows a possible embodiment of the electronic circuit according to the invention.
Figure 3:
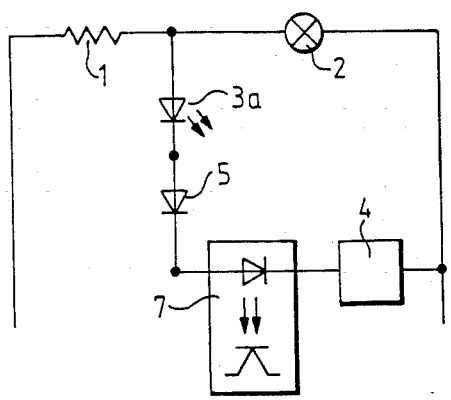
FIG. 3 is a block circuit diagram of an embodiment of the invention expanded by a coupling element.

As shown in FIG. 2, the visual indicator is an optoelectronic display of LED 3a and the electronic evaluation system 4 may be composed of a voltage or temperature dependent component in the form of, for example, a Zener diode 6a, an excess voltage arrester 6b, a varistor or thermistor 6c, or the like. The series connection of the component 6a, 6b, or 6c and the optoelectronic component 3a, and possibly a protective diode 5, is connected in parallel with the lamp 2 to be monitored. The voltage across element 6a, 6b, or 6c is matched to lamp 2 in such a manner that, in the proper operational state of lamp 2, the current flowing through element 6a, 6b or 6c is so slight that a visual indicator 3a (or 3) does not light up. If lamp 2 is defective, the voltage across element 6a, 6b or 6c increases to such an extend that, due to its characteristic, the element becomes conductive, causing the indicating component 3a to detect and optically indicate the malfunction. If this signal or an alarm indicating the detection of a malfunction is to be discernible at a remote location in a voltage-free or galvanically decoupled manner, an optocoupler 7 may be provided in addition to the visual indicator 3 or 3a as shown in FIG. 3. Alternatively, the optocoupler 7 may be provided instead of the visual indicator 3 or 3a.

Figure 4:
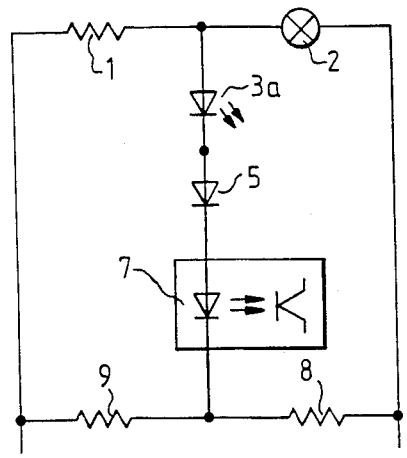
FIGS. 4 and 5 are block circuit diagrams of two arrangements according to the invention in the form of a bridge connection.
Figure 5:
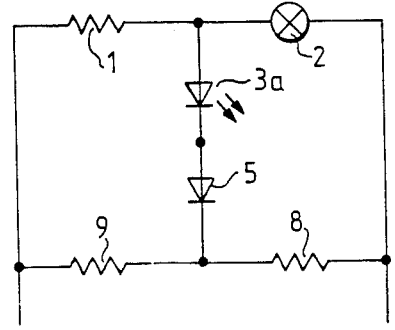

Instead of the voltage controlled embodiment, the same functions can be realized in an analogous manner with a current controlled device. FIGS. 4 and 5 show a solution in the form of a bridge circuit with and without an optocoupler 7 for galvanic decoupling of an output signal, respectively. Again, the series connection of resistor 1 and lamp 2 constitute the alarm device and in this arrangement these components form two legs of the bridge circuit. The other two legs of the bridge circuit are formed by resistors 8 and 9 which are selected so that only a slight or not current is able to flow in the transverse branch including visual indicator 3 and possible a protective diode 5 and/or an optocoupler 7. In the case of a malfunction (defective lamp 2), the bridge is not balanced, so that a transverse current flows and is indicated by the visual indicator 3 or 3a.

Figure 6:
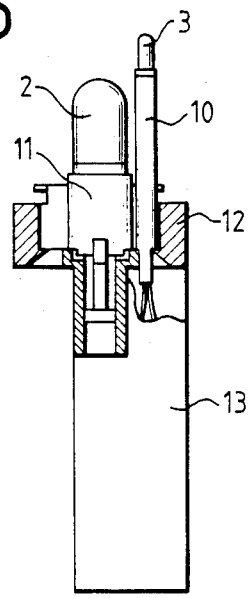
FIGS. 6 and 7 show different physical configurations of the indicating device according to the invention.
Figure 7:
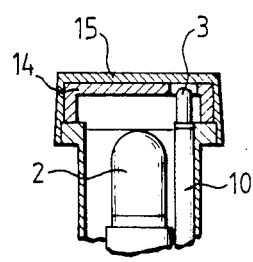

The structural solution of the lamp malfunction indicator according to the invention s shown in FIG. 6 and includes an indicator lamp 2 and a lamp socket 11 fastened to a carrier 12 forming part of a housing 13 for the electronic circuit 4. The visual indicator 3 is mounted in a hollow insulating member 10, e.g., an insulating hose or tube, which extends through the carrier 12 into the housing 13. The electrical leads for connecting the signalling device or lamp 3a with the electronic circuit 4 within the housing 13 extend through the insulating member 10. Preferably, as shown in FIG. 7, the lamps 2 and indicator 3 are covered with a cap 15 having a diffusing screen 14 on its inner surface, with the diffusing screen 14 being provided with a through bore for the visual indicator 3.

It will be understood that the above description of the present invention is susceptible to various modifications, changes and adaptations, and the same are intended to be comprehended within the meaning and range of equivalents of the appended claims.

What is claimed is:

1. In an arrangement for monitoring and reporting a malfunctioning indicator lamp in control, switching safety and indicator systems, comprising an indicator lamp connected in a circuit to be monitored via a series resistor, and the series connection of a visual indicator and an electronic circuit, whose conduction is controlled in dependence on the operating state of said indicator lamp, connected in parallel with the bridging said indicator lamp; the improvement wherein: said electronic circuit is composed of a bi-directional voltage or temperature dependent semiconductor device or resistor which can handle reverse polarity voltages equally well in both directions; and said arrangement further comprises a protective diode connected in series with said visual indicator and said electronic circuit, and a coupling circuit means, connected in series with said visual indicator, for generating a galvanically decoupled signal.

2. An arrangement as defined in claim 1, wherein said visual indicator comprises an incandescent bulb, a light emitting diode (LED), or an LED or LCD display.

3. In an arrangement for monitoring and reporting a malfunctioning indicator lamps in control, switching safety and indicator systems, comprising an indicator lamp connected in a circuit to be monitored via a series resistor, and the series connection of a visual indicator and an electronic circuit, whose conduction is controlled in dependence on the operating state of said indicator lamp, connected in parallel with the bridging said indicator lamp; the improvement comprising: coupling circuit means, responsive to the conductive state of said electronic circuit, for generating a galvanically decoupled electrical signal indicating the conductive state of said electronic circuit and of said visual indicator.

4. An arrangement as defined in claim 3, wherein said coupling circuit means is connected in series with said visual indicator.

5. An arrangement as defined in claim 3, wherein said electronic circuit is composed of a voltage or temperature dependent semiconductor device or resistor.

6. An arrangement as defined in claim 5, further comprising a protective diode connected in series with said visual indicator and said electronic circuit.

7. An arrangement as defined in claim 3 wherein: said indicator lamp is mounted in a socket disposed on an insulating carrier; and said visual indicator is mounted adjacent said indicator lamp in a insulating tube which is secured to said carrier.

8. An arrangement as defined in claim 7 wherein: said lamp and said visual indicator are covered by a cap fastened to said carrier and having a diffusion screen on its inner surface; and said diffusion screen has a through bore onto which said visual indicator extends for holding same in place.

9. An arrangement as defined in claim 7 further comprising a housing attached to said carrier for accommodating said electronic circuit.

* * * * *